United States Patent [19]

Wang et al.

[11] Patent Number: 5,553,018
[45] Date of Patent: Sep. 3, 1996

[54] NONVOLATILE MEMORY CELL FORMED USING SELF ALIGNED SOURCE IMPLANT

[75] Inventors: Hsingya A. Wang; James J. Hsu, both of Saratoga, Calif.

[73] Assignee: Advanced Micro Devices, Inc., Sunyvale, Calif.

[21] Appl. No.: 484,580

[22] Filed: Jun. 7, 1995

[51] Int. Cl.⁶ .................................................. H01L 29/68
[52] U.S. Cl. ...................... 365/185.01; 257/314; 257/315
[58] Field of Search ....................... 365/185.05; 257/314, 257/315, 316, 317, 318, 319, 320, 321, 322

[56] References Cited

U.S. PATENT DOCUMENTS

| | | | |
|---|---|---|---|
| 4,500,899 | 2/1985 | Shirai et al. ........................... | 257/315 |
| 5,103,274 | 4/1992 | Tang et al. ............................. | 257/321 |
| 5,394,001 | 2/1995 | Yamaguchi et al. ............... | 365/185.05 |

*Primary Examiner*—David C. Nelms
*Assistant Examiner*—Vu A. Le
*Attorney, Agent, or Firm*—Michael A. Lechter

[57] ABSTRACT

A memory device, such as a flash EEPROM, employs a high energy implantation to form common source line, avoiding the necessity of self-aligned source etch processes. The use of the high energy implantation, and avoiding the etching process, provides for greater cell uniformity, and better $V_T$ distribution.

4 Claims, 7 Drawing Sheets ns 5,553,018

NONVOLATILE MEMORY CELL FORMED USING SELF ALIGNED SOURCE IMPLANT

BACKGROUND OF THE INVENTION

The present invention relates to high density semiconductor devices and to methods for forming and connecting active regions and components of a high density semiconductor device, and in particular, connecting the source regions of the cells in a memory array.

In general, memory devices such as a flash electrically erasable programmable read only memory (EEPROM) are known. For example, referring to FIGS. 1, 2, and 2A, a flash EEPROM 100, commonly comprises a single substrate 102 in which one or more high density core regions 104 and a low density peripheral portion 106 are formed. High density core 104 typically comprises at least one M×N array 104 of individually addressable, substantially identical memory cells 200 (FIGS. 2, 2A). Low density peripheral portion 106 typically includes input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations.

Referring now to FIGS. 2 and 2A, each cell 200 in core 104 typically comprises: source 202, drain 204, and channel 206 semiconductor regions formed in substrate 102 (or in a an isolation well); and a stacked gate (word line) structure 210. Gate structure 210 suitably comprises: thin gate dielectric layer 212 (commonly referred to as the "tunnel oxide") formed on the surface of substrate 102 overlying channel 206; a floating gate 214 overlying tunnel oxide 212; an interpoly dielectric 216 overlying floating gate 214; and a control gate 218 overlying interpoly dielectric layer 216. Cells 200 are arranged in a series of rows and columns.

In the completed array, the control gates 218 of the respective cells 200 in a row are formed integral to a common word line (WL) associated with the row. Columns of cells are arranged such that adjacent cells in a column share a common semiconductor region as source or drain regions: The source 202 of each cell in a column (excepting end cells) is formed in a common region with one of the adjacent cells, e.g., the preceding cell in the column; Likewise, the drain of the cell is formed in a common region with the drain 204 of the other adjacent cell, e.g., next succeeding cell in the column. The drain of each cell in a column of cells is connected by a conductive bit line (BL) (FIG. 2A) comprising an overlying layer of metal connected to each drain 204 of the cells 200 within the column. Additionally, the sources of each cell 200 in a row (and hence pairs of rows) are interconnected by a common source line CS (FIGS. 2, 2A) formed in substrate 102, as will be described. Any particular cell 200 within array 104 can be individually addressed (programmed and read) by operating upon one word line and one bit line.

Typically, in forming an EEPROM 100, a pattern of field oxide regions 220 is initially formed to provide electrical isolation between the respective devices of memory device 100. For example, field oxide regions are used to provide isolation between core array 104 and the devices of peripheral region 106, as well as between the various columns of cells 200 within core array 104. Field oxide regions are conventionally formed using a mask and selective growth process: a layer of thermal oxide ("barrier oxide" or "pad oxide") is grown or deposited over the surface of substrate 102; a mask, frequently composed of nitride, is deposited on the barrier oxide, and patterned to cover those regions of substrate 102 in which devices are to be formed (herein referred to as active regions); field oxide is grown in the exposed areas of the barrier oxide, by for example, local oxidation of silicon (LOCOS); and the masking layer and barrier oxide are stripped to expose the underlying substrate 102. In general, referring to FIG. 2, within core 104, the selective growth process results in alternating parallel strips of field oxide 220 and exposed regions corresponding to the columns of cells 200 in the array.

Stacked gate-word line structures 210 are then typically formed. For example, tunnel dielectric 212, suitably comprising a thin (e.g. approximately 100 angstroms) layer of oxide, is initially formed on substrate 102 by a suitable technique, such as, for example, thermally oxidizing the surface of substrate 102 or by depositing a suitable material on substrate 102. A layer of suitable conductive polysilicon (e.g., polycrystalline silicon), that will ultimately form floating gates 214, is typically then formed on tunnel dielectric 212. For example, conductive polysilicon may be deposited by any suitable technique, e.g., conventional chemical vapor deposition (CVD). The polysilicon layer is typically then masked and etched to remove strips overlying field oxide regions 220, leaving isolated strips of polysilicon on top of tunnel dielectric 212 overlying the substrate regions corresponding to the columns of cells 200 of array 104 (i.e. the regions in which source, channel, and drain regions of cells in the column will be formed). A layer of suitable dielectric material, such as, e.g., an oxide-nitrate-oxide (ONO) layer, that will ultimately form interpoly dielectric 216 is typically then formed by a suitable technique. For example, where interpoly dielectric 216 is ONO, it is suitably formed by growing a layer of oxide, depositing a layer of nitrate, followed by growing another layer of oxide. Interpoly dielectric 216 layer, in the completed array, insulates control gates 218 from floating gates 214 in the individual cells and electrically isolates the adjacent columns of floating gates 214 in array 104. Another layer of suitable conductive polysilicon (e.g., polycrystalline silicon), that will ultimately form control gates 218 (and word lines WL connecting the control gates of the cells in the respective rows of array 104) is typically then deposited on the interpoly dielectric layer, by a suitable technique, such as, for example, by conventional chemical vapor deposition (CVD). If desired, a silicide layer (not shown) may be provided over polysilicon layer 218 to reduce resistance. Portions of the respective polysilicon and interpoly dielectric layers are typically then selectively removed, to define stacked gate structures 210 on tunnel dielectric layer 212, i.e., to form the floating gates 214, interpoly dielectric layer 216 and control gates 218 of the individual cells, and word lines WL (portions of interpoly dielectric 216 and control gate polysilicon layers, bridging field oxide regions 220, to connect the respective cells of the rows of the array). This is typically effected by suitable masking and etching techniques. When completed, this etch creates respective generally parallel word-line structures 210 separated by a distance $D_{WL}$, as shown in FIG. 2.

Conventionally, the portions of field oxide 220 and tunnel dielectric 212 between every second pair of adjacent word lines 210 in array 104 (i.e., the regions, generally indicated as 222, where source regions 202 are to be formed and the portions of field oxide 220 disposed between source regions 202 of the corresponding cells of adjacent columns) are then typically removed, in preparation for formation of the common line (CS, FIG. 2) connecting the sources. This is typically effected using a conventional Self-Aligned Source (SAS) etch As will be discussed, the selective etch, however, typically removes not only the exposed field oxide regions 220, but also the exposed tunnel oxide 212, a portion of the exposed polysilicon, and a portion of the underlying substrate 102.

In a conventional process, source 202, common line CS, and drain 204 regions are then formed. Source 202 and common source line CS are typically formed by initially effecting a conventional double diffusion implant (DDI), with the SAS mask still in place. The DDI implants a first dopant (e.g. n-type), suitably phosphorous, to form a deeply diffused but lightly doped N well 202A (FIG. 2), establishing a graded source-channel junction. The SAS mask is then removed. The DDI implant is typically driven deeper into substrate 102, by subjecting substrate 102 to a thermal cycle at high temperature (e.g. 1050 degrees Celsius). A shallow second implant, commonly referred to as a medium diffused drain (MDD) implant, is then performed (e.g., with arsenic) to create a more heavily doped, but shallower, n+ well 202B embedded within deep N well 202A. The MDD implant also forms a shallow, abrupt drain 204.

Conventionally, periphery transistors, passivation layers, and conductive interconnect layers (formed of, for example, polysilicon or metal) are then formed, the entire device is then oxidized to form a sealing layer of silicon dioxide (not shown) and finished and packaged for distribution.

Current is selectively conducted between source 202 and drain 204 in accordance with the electric field developed in channel 206 by gates 214, 218. By appropriately charging (programming) and discharging (erasing) floating gate 214, the threshold voltage $V_T$ of cell 200 (i.e., the voltage $V_G$ that must be applied to control gate 218 to cause current flow between source and drain above a predetermined level) may be selectively varied to program cell 200.

An individual cell 200 is programmed by charging floating gate 214 through high energy electron injection, often referred to as hot electron injection. By applying the appropriate potentials to source 202, drain 204, and control gate 218, hot electrons are injected from channel 206 through tunnel dielectric 212 to negatively charge floating gate 214. Charging floating gate 214 with a negative potential raises the threshold voltage of the cell by a predetermined amount $V_t$ from a first nominal value $V_{T1}$ to a second nominal value $V_{T2}$. As a result, a programmed cell 200 ($V_T > V_{T2}$) conducts substantially less current during a subsequent read operation than an unprogrammed cell 200 ($V_T < V_{T1}$) having no charge on floating gate 214.

During a read operation, a predetermined voltage $V_G$ is applied to control gate 218 of selected cell 200. If the selected cell 200 is unprogrammed ($V_T < V_{T1}$), the gate voltage $V_G$ exceeds the threshold voltage $V_{T1}$ of the cell, and cell 200 conducts a relatively high current (above a predetermined upper threshold level, e.g. 100 microamps). Conduction of such high level current is indicative of a first state, e.g., a zero or logical low. On the other hand, if the selected cell 200 has been programmed ($V_T > V_{T2}$), gate voltage $V_G$ is less than the threshold voltage $V_{T2}$ of the cell, and the cell is non-conductive, or at least conducts less current (below a predetermined lower threshold level, e.g. 20 microamps). Conduction of such low level current is indicative of a second state, e.g., one or logical high.

In contrast to the programming procedure, flash EEPROMs are typically bulk-erased, so that all of cells 200 in array 104 (i.e. connected to a common source line CS) are simultaneously erased. Appropriate potentials applied to the source 202, drain 204, and control gate 218, cause electron tunneling from floating gate 214 to source 202 (or drain 204) via Fowler-Nordheim (F-N) tunneling. For example, electrons stored during programming on floating gate 214 tunnel through dielectric 212 in the area (referred to as a tunnel region 203) where floating gate 214 overlaps source region 202. F-N tunneling occurs simultaneously for all cells 200 within memory array 104, erasing entire array 104 in one "flash" or operation.

Because each cell 200 is connected to common source line CS, all cells 200 in array 104 are erased for the same amount of time. Ideally, each cell 200 in array 104 requires the same amount of time to erase, i.e. to remove electrons from floating gate 214 and achieve a lower selected threshold voltage. Erase times among cells 200 within array 104, however, differ widely. Because of the variation in erase times, each cell 200 must be erased for the amount of time required to erase the slowest cell in array 104. Erasing faster cells 200 for too long, however, results in over-erasure. Over-erasure generates a positive charge on floating gate 214, which excessively lowers the threshold voltage $V_T$ of cell 200, in some instances to the extent of establishing a negative threshold voltage ($V_T < 0$). As a result, the over-erased cell 200 may be continuously activated, even when control gate 218 is grounded ($V_G = 0$ volts), so that cell 200 always conducts during a read operation, regardless of whether over-erased cell 200 is the cell selected for reading. In addition, the increased $V_t$ in threshold voltage effected by programming, may not be sufficient to raise the threshold voltage $V_T$ of the over-erased cell above the predetermined voltage $V_G$ applied to control gate 218 of selected cell 200, so that even when programmed, the over-erased cell conducts upon application of $V_G$ during the read process, giving an erroneous reading.

The current conducted by over-erased cells 200 in a column during a read operation is known as "column leakage current." Column leakage current manifests itself by degrading or destroying the memory's reliability and endurance. As discussed above, the bit value of a selected cell 200 depends on the magnitude of the drain current provided at the associated bit line BL. Drain 204 of each cell 200 in a column, however, is connected to the associated bit line BL. Ideally, the only cell in the column biased for possible conduction is the cell in the selected word line WL; the predetermined voltage $V_G$ is applied to the gates of cells on the selected word line and all other gates are grounded during the reading process. If selected cell 200 is unprogrammed, current in excess of the upper threshold value will be provided on the bit line, indicating e.g., a zero. If the selected cell is programmed with a "1", the drain current of the cell (and, ideally, the bit line), is below the lower threshold value during the read operation. However, the current in the bit line reflects the cumulative current flow from all of the cells in a column. Accordingly, if any of the cells in the column are over-erased and conduct significant current during the read operation, the current flow in the bit line may be in excess of the upper threshold value. Consequently, the read operation generates a logical zero regardless of which cell in the column is selected or whether the selected cell is programmed. In severe cases, a single over-erased cell disables the entire column. In another case, many of the cells may be slightly over-erased which provides a cumulative column leakage current in excess of the upper threshold value. For example, if each cell in a column of 512 cells leaks 0.2 microamps, the total column leakage current is 102.4 microamps, in excess of the upper threshold value of 100 microamps, thereby disabling the entire column. Milder cases may simply degrade the performance of the memory over time, greatly reducing the reliability and endurance of the device, i.e. the number of cycles the device can be successfully programmed and erased.

The problem of over-erasure is recognized. For example, U.S. Pat. No. 5,335,198, to Van Buskirk et al., issued Aug. 2, 1994, discloses an over-erasure correction method, involving sensing an over-erase condition (i.e. when the voltage on floating gate 214 is positive) and individually programming each over-erased cell until the cell is properly erased (i.e., when the positive voltage on the floating gate 214 is eliminated). Disadvantageously, individually reprogramming all of the over-erased bits in an array of cells introduces considerable delay. If many of the cells within an array are over-erased, the time required to correct all of these cells is prohibitive. In addition, the necessary circuitry for sensing an over-erase condition occupies valuable space on the semiconductor substrate.

It has been found that the disparity of erase times in conventional EEPROM cells 200 within array 104 is caused, at least in part, by structural and doping variations among cells 200. For example, the erase time of cell 200 is affected by the F-N tunneling rate through tunnel dielectric 212, which, in turn, varies inversely with the square of the distance between floating gate 214 and source 202 in tunneling region 203 and varies directly with the doping concentration of tunneling region 203 near source 202, and specifically at the surface of channel 206. The geometry of each cell 200 near tunneling region 203, however, is difficult to control without significantly increasing the size of each cell. For example, as noted above, in forming memory devices a Self-Aligned Source (SAS) etch is typically used to remove the portions of field oxide 220 disposed between source regions 202 of the corresponding cells of adjacent rows (hereinafter referred to as the "inter-source" field oxide regions). Such an etch often causes variations in the geometries of the individual cells. Referring to FIGS. 3 and 4, a masking layer of photo resist 302 is deposited over array 104, then patterned to mask (cover) drain regions 204 and the field oxide regions 220 isolating the drains of cells in adjacent columns, with open strips 304 exposing the source regions 202 of the corresponding cells of adjacent rows and the inter-source portions of field oxide 220; openings 304 have edges 306 disposed along the centers of the word lines 210 of adjacent rows of cells. A highly selective etch is then performed to remove the exposed portions of field oxide 220. For example, a conventional SAS etch is described in U.S. Pat. No. 5,120,671, issued Jun. 9, 1992, to Tang et al.

While the etch is highly selective in that it etches the field oxide at a much higher rate than the polysilicon word line or silicon, it is not totally selective; portions of the silicon of source region 202, as well as portions of the exposed polysilicon, are etched away. Referring to FIGS. 3 and 3A, the portions of tunnel dielectric 212 overlying the portions of substrate 102 where source regions 202 are to be formed are exposed by openings 304, as well as the inter-source portions of field oxide 220. The etch operates upon tunnel oxide 212 at the same rate as field oxide 220. Field oxide 220 is typically considerably thicker (e.g., 4000–5000 Angstroms) than tunnel oxide 212 (e.g., 100–200 Angstroms). By the time the inter-source portions of field oxide 220 are removed, not only has the etch removed the gate oxide 212 overlying the source region, but, as seen in FIG. 3A, it has also removed a portion of the silicon substrate 102 in the source region, producing a gouge of depth $D_G$, typically of on the order of 200 Angstroms, in upper surface 308 of source region 202. The depth $D_G$ of the gouge in source region 202 and the profile of surface 308 significantly affect the diffusion of dopants into tunneling region 203. In particular, the gouge increases the distance through which the dopants must travel to extend to the surface of channel 206. Consequently, the gouge in surface 308 tends to decrease doping concentration in source 202 in tunneling region 203 when compared to an ungouged surface. Significantly, the gouging varies from cell to cell, creating non-uniformity.

Further, as seen in FIGS. 3A and 3B, a portion 310 of the exposed area of word line 210 is also etched away. This tends to create a longitudinal step of depth $D_{G2}$, typically on the order of 400 Angstroms, on the source side of the control gates 218 of the respective cells. This tends to increase the resistance of the word line.

Moreover, referring to FIGS. 3B and 4A, the etching process typically does not produce a vertical edge where field oxide 220 is removed. Rather, the process tends to produce sloping edges 412, extending outwardly from the edge of word line 210. Sloping edges 412 tend to constrict the portion 414 of substrate 102 exposed for implantation in the vicinity of field oxide 220. Thus, the width of common source line CS connecting adjacent source regions 202, tends to be less than the distance $D_{WL}$ between respective adjacent word lines (the length of the source regions), and the resistance of the common source line CS is increased as compared to a wider region. In conventional memory arrays, such resistance is in the range of from 150 to 1000 ohms per bit. For example, the common source line CS of a memory array created using an SAS etching process may present a 3 square resistance structure (length in direction of current flow to width ratio), equating to approximately 180 Ohms per bit.

For miniaturization, it is desirable to dispose adjacent word lines as closely together as possible, i.e., minimize distance $D_{WL}$. The constriction of source line CS connecting adjacent source regions 202 by sloping edges 412 (and concomitant increased resistance), tends to be a limiting factor in miniaturization.

SUMMARY OF THE INVENTION

The present invention provides a mechanism avoiding the problems introduced by a self-aligned source etch process without sacrificing the advantages of self-aligned source technology. Rather than performing a self aligned source etch to remove the field oxide to facilitate forming the connection between adjacent source regions, a field oxide layer is left intact, and a high energy implantation process employed in conjunction with self aligned source mask to form the inter-source connection.

BRIEF DESCRIPTION OF THE DRAWING

The preferred exemplary embodiment of the present invention is described in conjunction with the appended drawing, in which like designations denote like elements, and.

DETAILED DESCRIPTION OF PREFERRED EXEMPLARY EMBODIMENTS

Figure 2A:
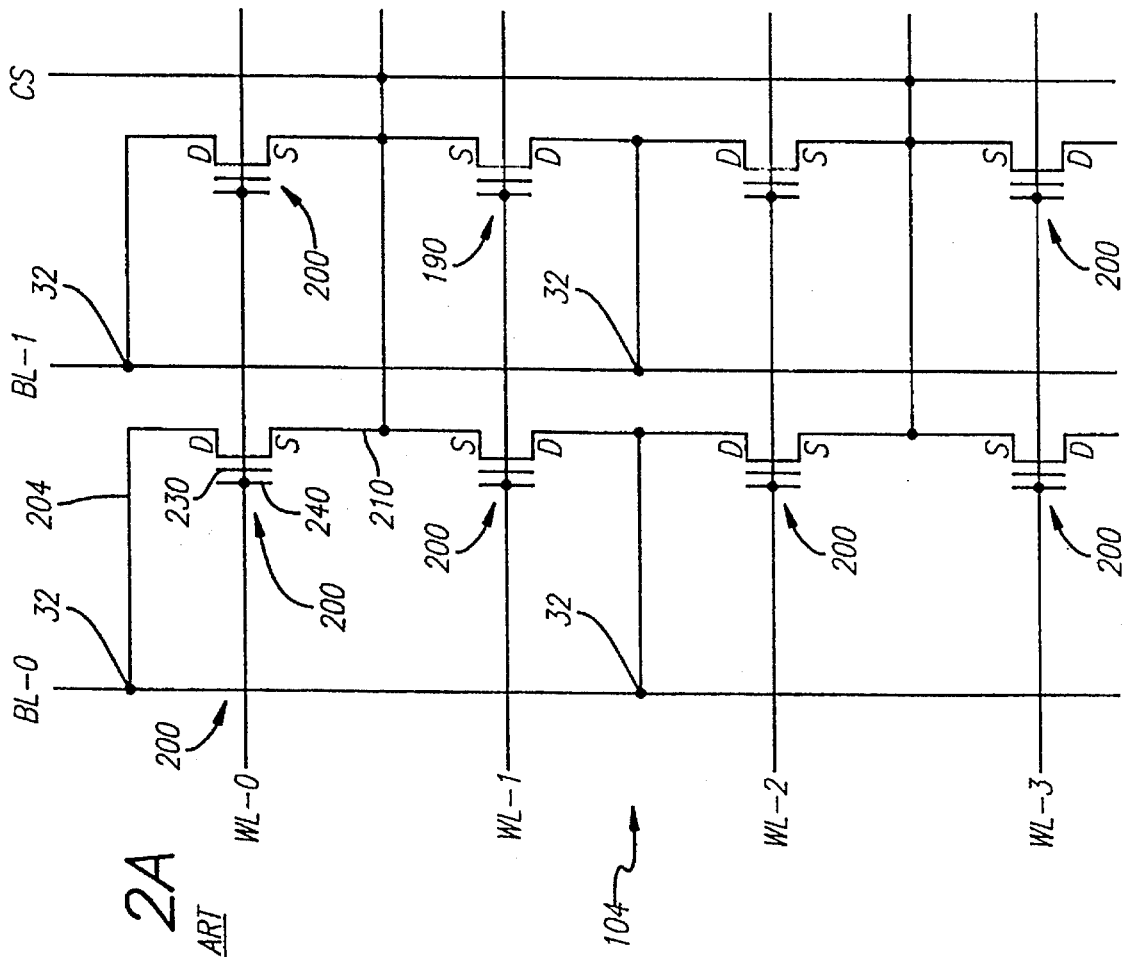
FIG. 2A is a schematic diagram of a portion of the cell array.
Figure 1:
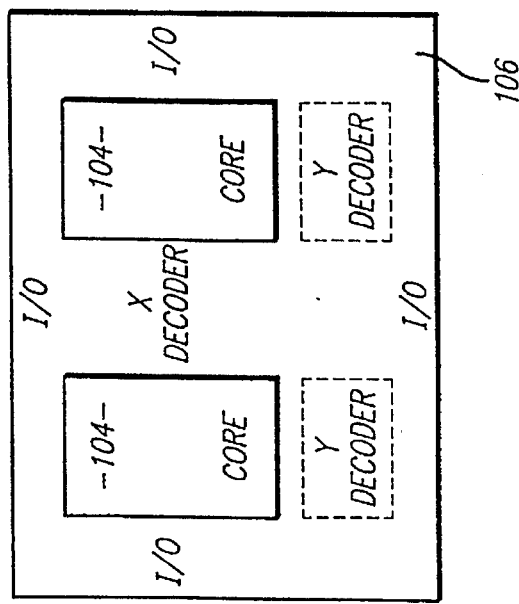
FIG. 1 is a top view of conventional memory device having an area of high density circuitry and an area of lower density circuitry.
Figure 2:
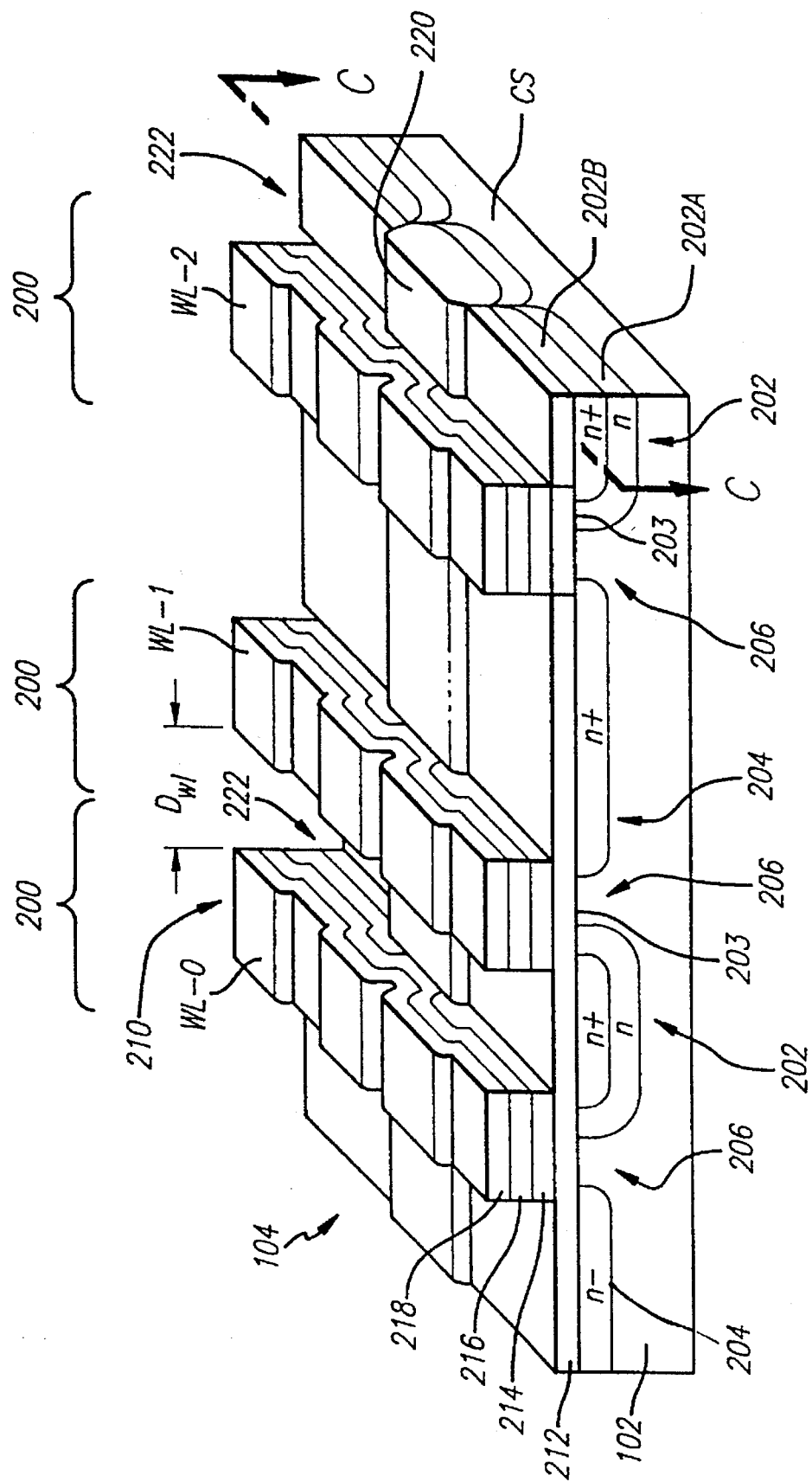
FIG. 2 is a partial, sectional perspective of a portion of an intermediate state (partially complete) of a cell array core 104.
Figure 3:
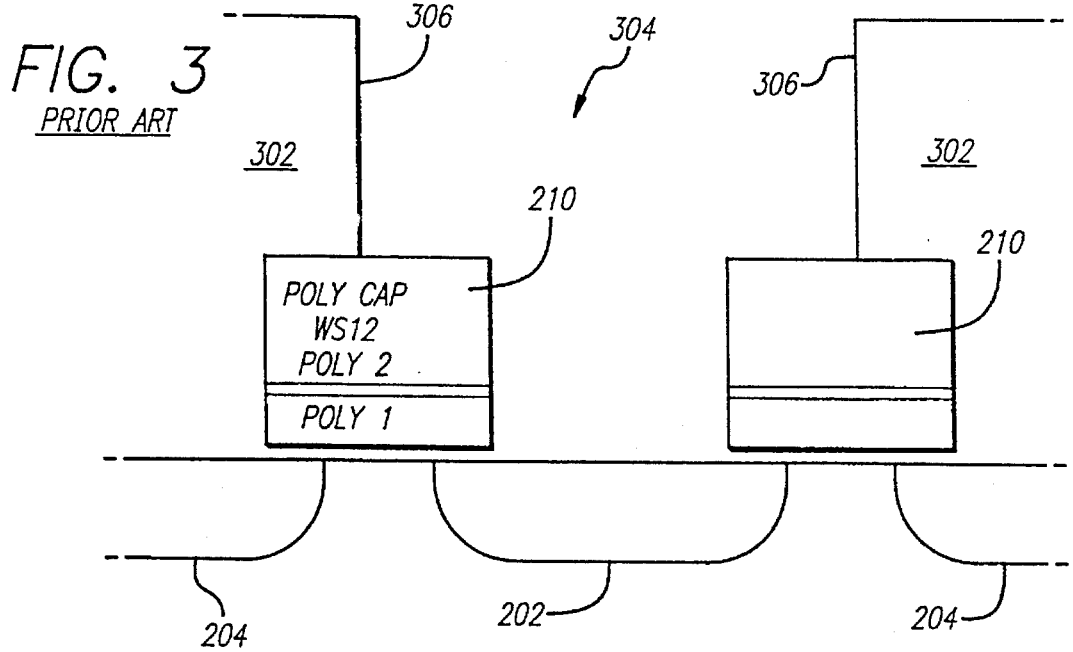
FIG. 3 is a partial, sectional view of an intermediate state (partially complete) of a portion of a cell array taken along section A—A in FIG. 3B, showing respective adjacent word lines and a self aligned source masking layer prior to a selective etching.
Figure 3A:
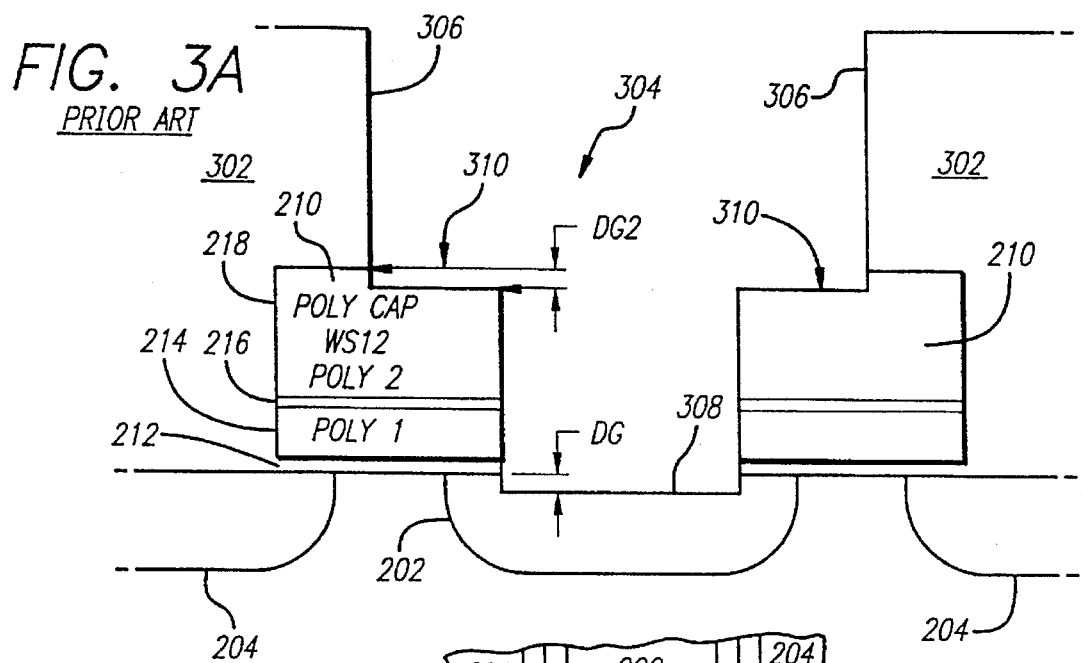
FIG. 3A is a partial, sectional view of an intermediate state (partially complete) of a portion of a cell array taken along section A—A in FIG. 3B, showing respective adjacent word lines and a self aligned source masking layer after a selective etching.
Figure 3B:
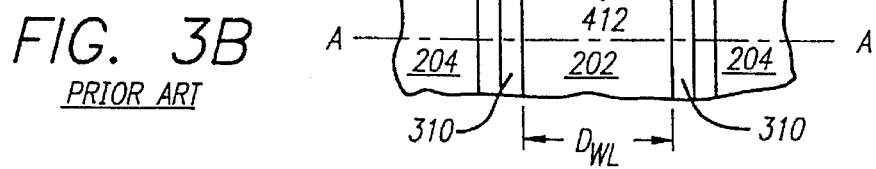
FIG. 3B is a partial, top view of an intermediate state (partially complete) of a portion of a conventional cell array showing respective adjacent word lines, field oxide, and source and drain regions, after a conventional self aligned source etching process.

Referring again to FIG. 2A, as previously noted, in forming an array 104 of memory cells 200, a pattern of field oxide regions 220 is initially formed on a suitable substrate 102 (e.g., silicon doped with p-type dopants, such as boron). Field oxide regions 220 are patterned to form strips interposed between the areas where columns of cells will be formed. A series of parallel stacked gate-word line structures 210 (one corresponding to each row) are then formed, perpendicular to and extending over field oxide strips 220, spaced apart by distance $D_{WL}$. The criss-crossing pattern of field oxide strips 220 and stacked gateword line structure may be formed by any suitable methodology. In conventional formation processes, as previously noted, a self-aligned source etch is performed to remove the inter-source portions of field oxide 220, followed by further doping in exposed regions of substrate 102 (in predetermined disposition to stacked gate structures 210) to form the source and drain regions of cells 200.

In contradistinction to conventional formation processes, in accordance with one aspect of the present invention, the inter-source connections are effected without performing a self aligned source etch to remove the inner-source field oxide regions by implanting a sufficiently high dose of dopants at a sufficiently high energy level to form low resistivity source interconnection regions underlying field oxide regions 220, electrically connecting adjacent source regions. In this manner, the nonuniformities and other disadvantages created by the etching process employed in conventional formation processes are avoided.

The implantation can be effected by any suitable method. For example, conventionally, implantation involves ionizing a gaseous form of the dopant, and subjecting the ions to a high level electric field. The electrical field accelerates the ions to cause them to penetrate into the wafer to a depth corresponding to the strength of the electric field.

Figure 4:
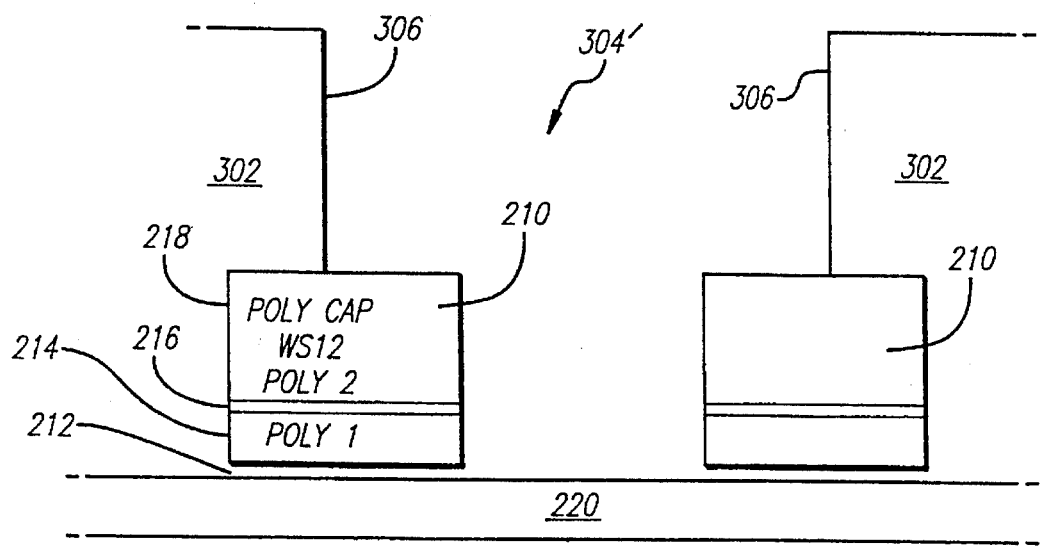
FIG. 4 is a partial, sectional view of an intermediate state (partially complete) of a portion of a cell array taken along section B—B in FIG. 3B, showing respective adjacent word lines and a self aligned source masking layer prior to a selective etching.
Figure 4A:
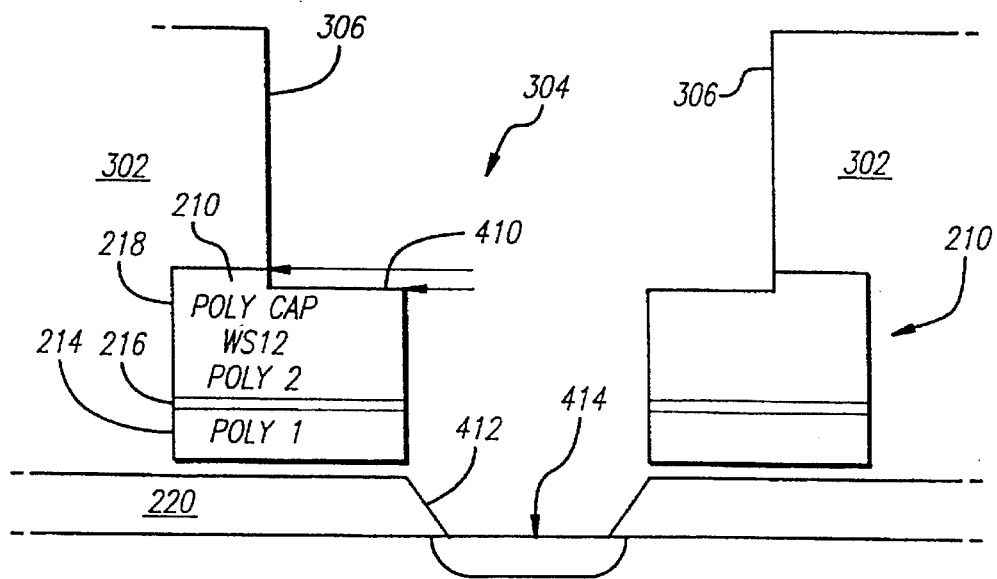
FIG. 4A is a partial, sectional view of an intermediate state (partially complete) of a portion of a cell array taken along section B—B in FIG. 3B, showing respective adjacent word lines and a self aligned source masking layer after a selective etching.
Figure 5:
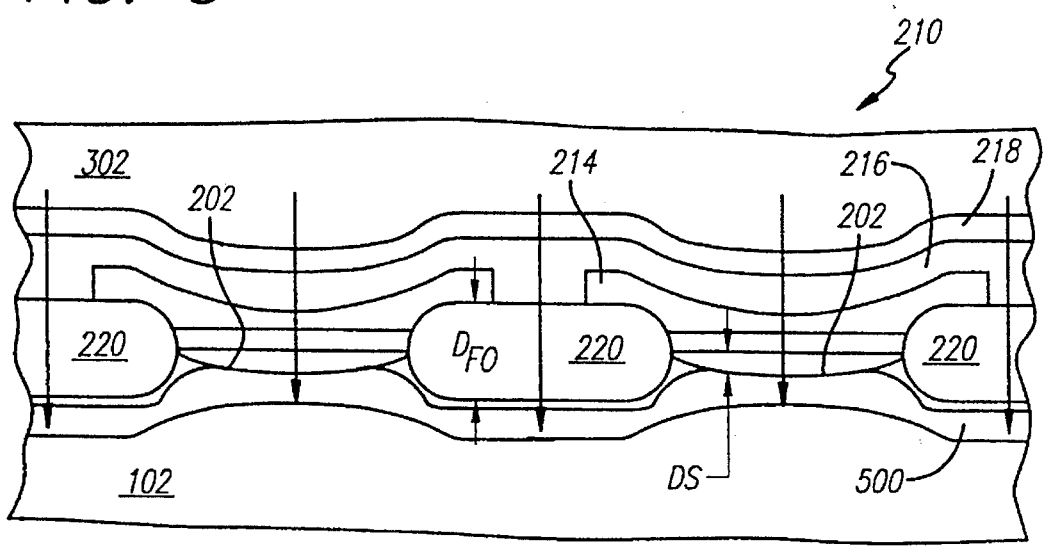
FIG. 5 is a partial, sectional view of an intermediate state (partially complete) of a portion of a cell array, taken along section C—C in FIG. 2, illustrating implantation of a source interconnect region in accordance with the present invention.

Implantation is effected at an energy level sufficient to cause the dopant to pass through the inter-source field oxide regions and locate within a predetermined region in substrate 102 to effect an electrical connection between the corresponding source regions of adjacent columns. For example, referring to FIGS. 4, and 5, a self-aligned source mask 302 is formed and patterned in a conventional manner to expose source regions 202 and inter-source portions of field oxide 220. A high energy implantation step is then effected on the exposed source regions 202 and inter-source field oxide 220 portions to implant a relatively low resistivity region 500 in substrate 102, underlying field oxide 220 and in contact with source regions 202.

The dopant dose is chosen to ensure a relatively low resistance, of, for example, from 20 to 40 ohms per bit (as compared to 150 to 1,000 ohms per bit in conventional structures) to provide such low resistivity, the dose is typically in the range of $2.5 \times 10^{14}$ to $1 \times 10^{16}$ ions/cm$^2$ preferably, the implantation provides a 0.75 square resistance structure (equating to approximately 45 ohms per bit) as compared to a 3 square resistance structure (equating to approximately 180 ohms per bit) in conventional structures.

In general, the implantation energy level should be sufficient to drive the dopants through inter-source field oxide portions 220 and into substrate 102. The energy level at which the implantation is effected is a function of the particular species of dopant employed, and the desired depth of the interconnect region 500, chosen to ensure electrical connection with source regions 202. In general, dopants employed are chosen to provide good conductivity, e.g., Arsenic (AS), Phosphorus (P) and Antimony (SB). In conventional structures, the thickness $D_{OF}$ of field oxide regions 220 are generally in the range of 400 to 5,000 angstroms, whereas the source region generally extends a distance $D_S$ into the substrate in the range of 200 to 3,000 angstroms.

Typical energy levels for various dopants sufficient to cause the dopant to pass through field oxide 220 and to form inter-connect region 500 in substrate 102 to make electrical connection with source region 202 are shown in TABLE I.

TABLE I

| DOPANT | ENERGY |
| --- | --- |
| Arsenic | 70 Kev–3 Mev |

TABLE I-continued

| DOPANT | ENERGY |
| --- | --- |
| Phosphorous | 35 Kev–700 Kev |
| Antimony | 90 Kev–5 Mev |

Figure 6:
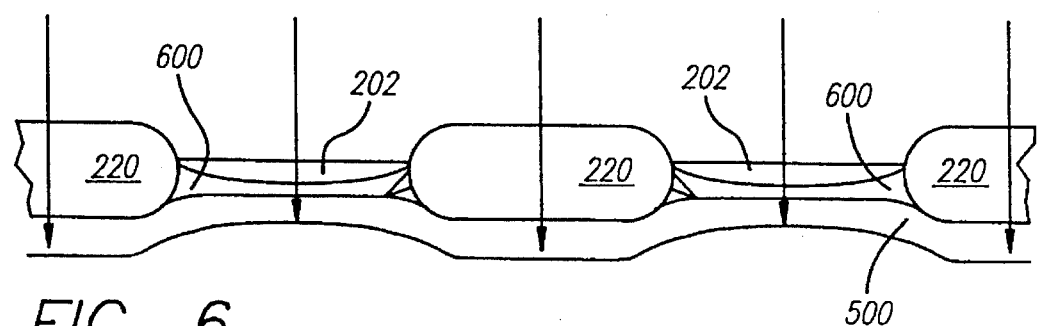
FIG. 6 is a partial, sectional view of an intermediate state (partially complete) of a portion of a cell array, taken along section C—C in FIG. 2, illustrating overly deep implantation of a source interconnect region.
Figure 7:
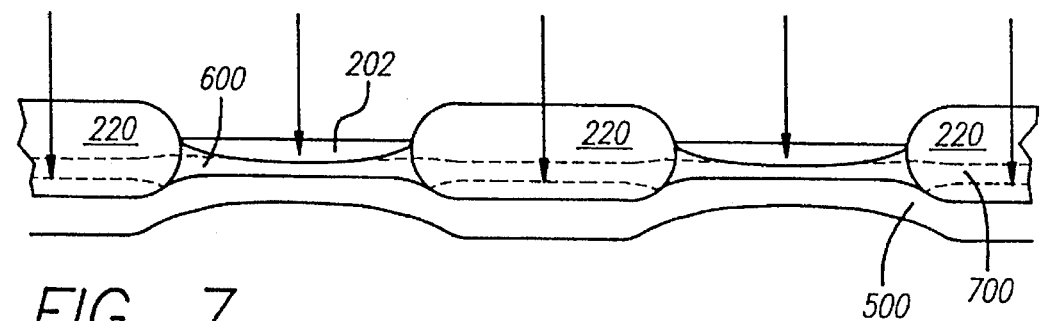
FIG. 7 is a partial, sectional view of an intermediate state (partially complete) of a portion of a cell array, taken along section C—C in FIG. 2, illustrating a two energy implantation of a source interconnect region in accordance with the present invention.

It has been determined that for a given energy level, dopants travel comparable distances through field oxide and silicon. Accordingly, referring to FIG. 6, in some instances, particularly those where field oxide 220 extends further into substrate 102 than does source region 202, use of energy levels sufficient to implant interconnecting region 500 in substrate 102 through field oxide 220, may dispose interconnect region 500 below, and out of contact with, source region 202, spaced apart from source 202 by an intervening portion 600 of substrate 102. In some instances, subjecting the device to a heat cycle to diffuse the dopants can effect contact between source regions 202 and inter-connect region 500. However, the thermal cycle tends to extend the width of the source connection region and excessive thermal cycle can interfere with the memory cell read and program operations. Alternatively, a second implantation at a lower energy level designed to implant dopants in intervening region 600 can be employed to effect electrical connection between inter-connect region 500 and sources 202. Referring to FIG. 7, supplemental implantation, effected at a lower energy level, is employed to implant dopants in region 600, effectively extending inner connect region 500 into electrical connection with source regions 202. Alternatively, if desired, different species can be implanted at the same or different energy levels to ensure the connection.

Figure 8:
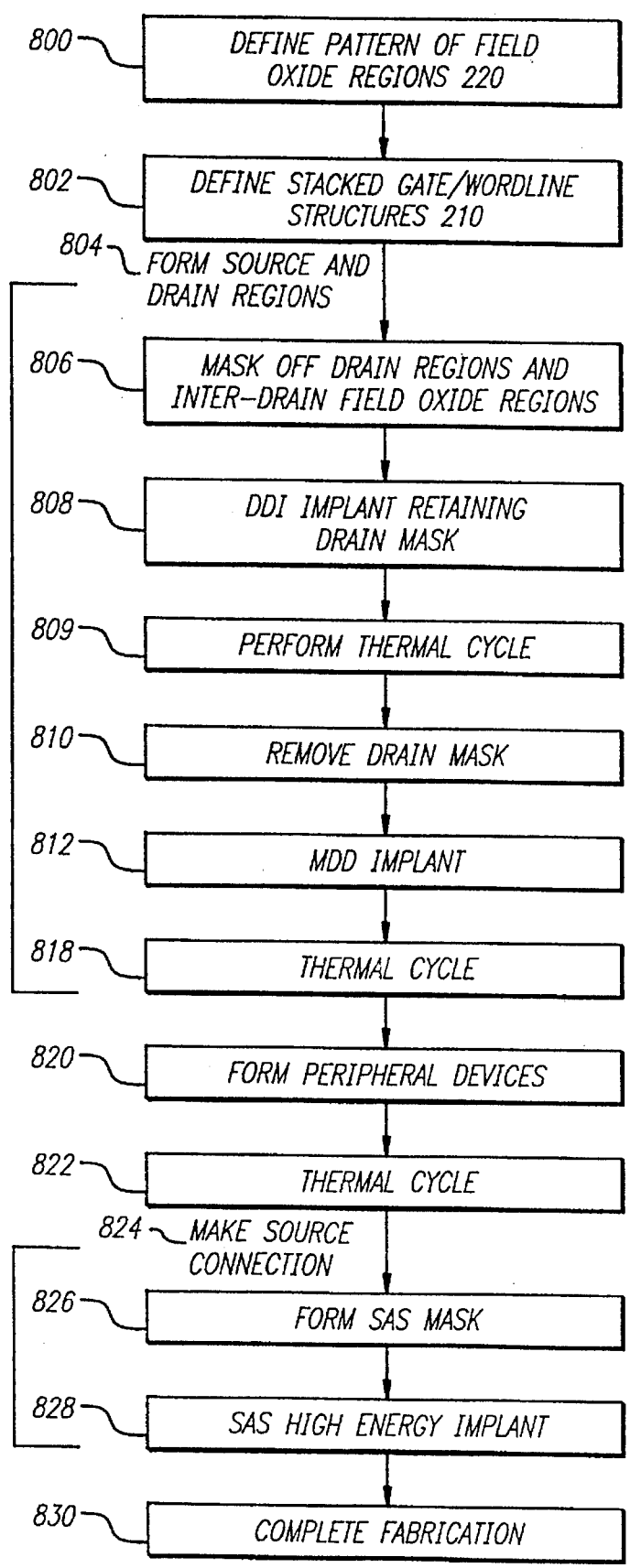
FIG. 8 is a flowchart of a formation process employing implantation of a source interconnect region in accordance with the present invention.

The formation of the inner source connection can be effected at various points during the overall formation process. For example, referring to FIG. 8, a pattern of field oxide regions 220 (Step 800) and gate/word line structures 210 (Step 802) are initially formed by any suitable techniques. The control gate 218 of word-lines 210 is suitably formed with a tungsten silicide film sandwiched between two polysilicon layers; The tungsten silicide reduces the resistance of gate 218, and also provides additional protection for the channel region during the high energy implantation. The source 202 and drain 204 regions are then formed in substrate 102 (Steps 804). Source and drain regions may be formed by any suitable procedure. For example: a self aligned source mask is formed to mask off the drain regions and inter-drain field oxide regions (Step 806); a conventional double diffusion implant (DDI) is effected with the mask in place (Step 808); a thermal cycle is performed (step 809); the mask is removed (Step 810); a medium defused implant (MDD) is effected (Step 812); then, a thermal cycle is effected at high temperature (e.g. 1050 degrees C.) to defuse the dopants (Step 818)

The devices in peripheral region 106 are then formed, by any suitable processes (Step 820) and a thermal cycle effected (typicly part of the peripheral device formation) (Step 822).

After the peripheral devices have been formed, and any attendant thermal cycles effected, the source interconnection is made (Steps 824). An SAS mask similar to that used in connection with doping the source regions is formed (Step 826). A high energy implant is then effected to create interconnect region 500 (FIG. 5) (Step 828). If necessary, or desirable, a second lower energy implantation can be performed to ensure electrical connection between sources 202 and interconnect region 500.

Array 104 and EEPROM 100 are then completed by any suitable process (step 830). For example, conventional techniques are thereafter suitably employed to form passivation layers, and conductive interconnect layers (formed of, for example, polysilicon or metal), wafer oxidation and packaging.

Figure 9:
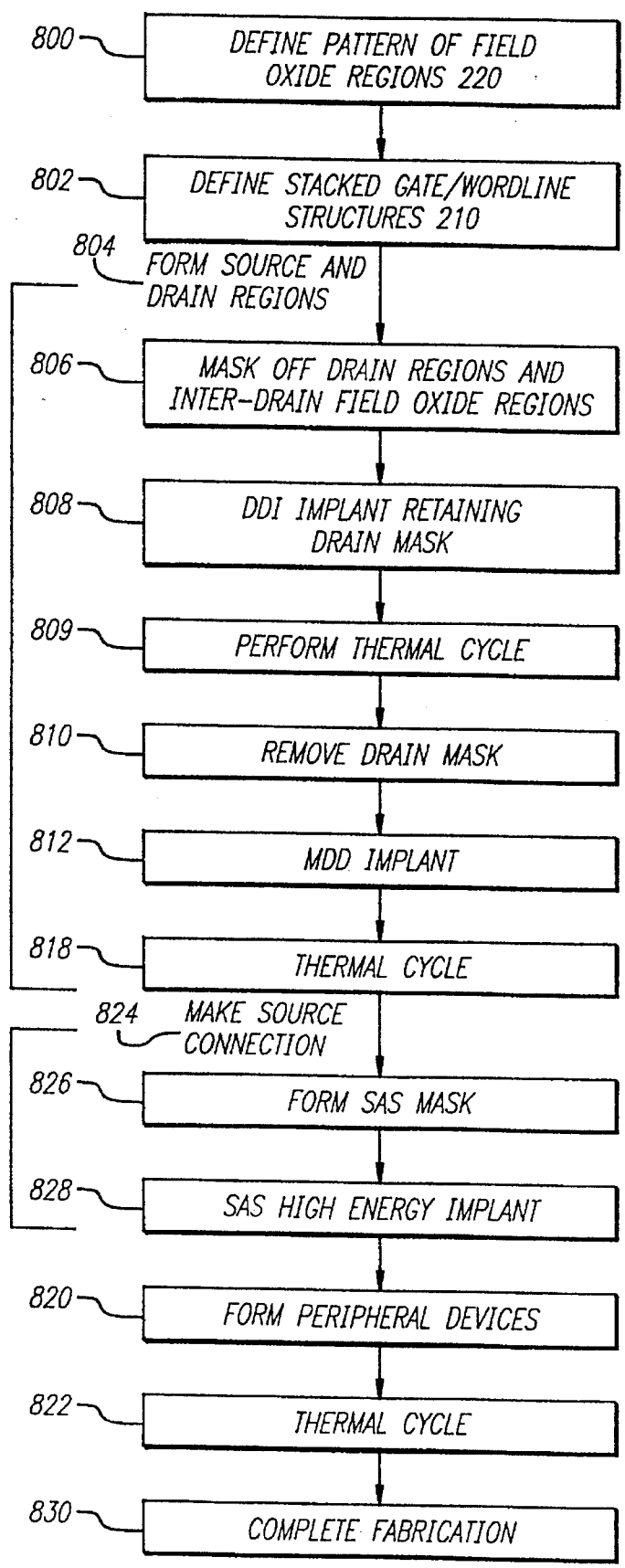
FIG. 9 is a flowchart of a an alternative formation process employing implantation of a source interconnect region in accordance with the present invention.

The point in the overall fabrication process at which the source interconnect implantation is effected is typically a function of a number of high temperature processes employed in the overall fabrication process, and the desired amount of diffusion. Where it is desired that interconnect region be diffused, the source interconnect implantation (Steps 824) can be effected earlier in the overall fabrication process. For example, referring to FIG. 9, the source interconnect implantation (Steps 824) can be effected prior to formation of peripheral devices (Step 820) so that interconnect region 500 is subjected to the attendant thermal cycles (Step 822).

Forming the source interconnect regions using high energy implantation, and avoiding use of an SAS etch, provides a number of advantages. The source connect region can extend the entire width of the space between word-lines $D_{WL}$, and is not subject to the constriction created by field oxide 220 in prior art processes. Accordingly, the resistance of the interconnect is considerably less than in the prior art (e.g., 0.75 square, as compared to 3 square). In addition, nonuniformities, and concomitant effect on $V_T$ distribution caused by the etching process is avoided.

The foregoing describes preferred embodiments of the present invention known to the applicants at the time of filing. Such embodiments, however, are merely exemplary. The invention is not limited to the specific forms described. Modifications to the embodiments described above are contemplated, may be made within the scope of the invention, as defined by the claims.

We claim:

1. A high density floating gate memory cell array formed in a semiconductor substrate, where each cell comprises source, channel and drain semiconductor regions in the substrate, the array comprising:

respective columns of cells;

respective continuous strips of field oxide, interposed between adjacent columns of cells;

respective stacked-gate-word-line structures disposed extending over the field oxide strips, and overlying the channel regions of each cell in a row of cells; and implanted interconnection regions, extending under the field oxide strips, electrically connecting the source regions of corresponding cells in adjacent columns.

2. The memory cell array of claim 1, where the resistance of the interconnection regions is less than two square.

3. The memory cell array of claim 1, where the resistance of the interconnection regions is less than one square.

4. The memory cell array of claim 1, where the resistance of the interconnection regions is approximately 0.75 square.

* * * * *

UNITED STATES PATENT AND TRADEMARK OFFICE
CERTIFICATE OF CORRECTION

PATENT NO. : 5,553,018
DATED : September 3, 1996
INVENTOR(S) : Hsingya A. Wang; James J. Hsu It is certified that error appears in the above-indentified patent and that said Letters Patent is hereby corrected as shown below:

Column 1, line 32, "in a an" should read --in an--

Column 8, line 54, "$D_{OF}$" should read --$D_{FO}$--

Signed and Sealed this

Twenty-fifth Day of February, 1997

Attest:

BRUCE LEHMAN

Attesting Officer

Commissioner of Patents and Trademarks